United States Patent [19]
August

[11] Patent Number: 5,468,920
[45] Date of Patent: Nov. 21, 1995

[54] PRINTED CIRCUIT BOARD HAVING RAISED CONDUCTOR PADS

[75] Inventor: Mark P. August, Los Gatos, Calif.

[73] Assignee: Apple Computer, Inc., Cupertino, Calif.

[21] Appl. No.: 279,018

[22] Filed: Jul. 22, 1994

[51] Int. Cl.⁶ .................................................. H05K 1/00
[52] U.S. Cl. .................. 174/267; 174/250; 174/260; 361/767; 361/772; 361/774; 439/59
[58] Field of Search .................................... 174/250, 260, 174/261, 267; 361/767, 772, 774, 777; 439/59, 61, 65

[56] References Cited

U.S. PATENT DOCUMENTS 5,309,316  5/1994  Yagi et al. .............................. 361/774

*Primary Examiner*—Morris H. Nimmo
*Assistant Examiner*—Cheryl R. Figlin
*Attorney, Agent, or Firm*—Burns, Doane, Swecker & Mathis

[57] ABSTRACT

A printed circuit board is installable into a slot of a cardedge connector such that contacts of the connector ride along electrically conductive, raised pads of the card. Each pad includes frontal edge segments which are inclined generally rearwardly toward a center axis of the pad so that if any of the contacts are laterally offset with respect to the center axis of its respective pad during installation, the offset contact will be re-directed toward the center axis in response to making engagement with one of the frontal edge segments.

10 Claims, 2 Drawing Sheets

PRINTED CIRCUIT BOARD HAVING RAISED CONDUCTOR PADS

BACKGROUND OF THE INVENTION

The present invention relates to printed circuit boards usable, for example, in personal computers and, in particular, to the configuration of electrical conductor pads formed on the printed circuit boards.

A conventional printed circuit board (p.c. board) 10, depicted in FIGS. 3 and 4, comprises a base 12, and a high density row of electrically conductive raised pads 14 formed preferably on each side 16 of the board, e.g., by an etching process. There may be two rows of staggered pads 14a, 14b as shown in FIG. 4, or only a single row of non-staggered pads. The pads 14a, 14b are typically gold plated and positioned to be engaged by gold plated flexible contacts 20 disposed within a slot 22 of a cardedge connector 24 (see FIGS. 1 and 2) when the board 10 is inserted into the slot.

Forward portions of the pads 14a may optionally comprise narrow traces 28 to provide smooth surfaces along which the contacts 20 can travel between the other pads 14b toward a wider rearward portion of the pad in order to prevent the gold plating from being rubbed off the contacts 20 after repeated removal and re-installation of the circuit board.

Heretofore, it has been necessary to manufacture the p.c. boards 10 and cardedge connectors 24 under very tight dimensional tolerances in order to ensure that the contacts properly engage the pads 14 once the p.c. board has been inserted into the cardedge connector. That is, if the pads 14a, 14b are not located with a high degree of precision on the base 12, or if too much relative lateral movement (i.e., rightward or leftward movement in FIG. 3) is permissible between the p.c. board and connector, the contacts, especially very thin contacts may follow a path which results in a lack of electrical contact between the contacts 20 and the pads 14a and/or 14b after the p.c. board has been installed. It has been surmised that if the dimensional tolerances are not sufficiently tight, one or more of the contacts 20 may follow a path P depicted in phantom lines in FIG. 4 wherein the contact is offset from the center axis CA of the respective pad 14a and travels laterally to the right (or left) off the pad 14a after traversing a frontal edge 32 of the pad, which edge 32 extends perpendicularly relative to the axis CA. A similar problem can occur in connection with the front edge 33 of the pads 14b.

While that problem can be avoided if sufficiently tight dimensional tolerances are maintained during manufacture of the p.c. board and cardedge connector, the need to adhere to such tight tolerances appreciably increases the manufacturing cost and effort.

SUMMARY OF THE INVENTION

The present invention relates to a printed circuit board for use with a cardedge connector having a plurality of contacts arranged to engage respective electrically conductive pads disposed on the printed circuit board. The printed circuit board comprises a base and a plurality of the electrically conductive raised pads which are disposed on a surface of the base. At least one pad includes at least one frontal edge segment disposed laterally outwardly with respect to a center axis of the pad. The frontal edge segment extends rearwardly toward the pad center axis for directing toward the pad center axis a rearwardly traveling contact which is offset laterally from the pad center axis.

The frontal edge segments can be substantially straight or concavely curved, for example.

The pad may include two frontal edge segments disposed on opposite sides of the center axis of the pad.

Each of the pads may include a rearward portion and a forward portion. The forward portion is narrower than the rearward portion, and the frontal edge is disposed at a juncture between the forward and rearward portions and are disposed laterally outwardly with respect to respective sides of the forward portion.

The invention also relates to the combination of the printed circuit board and the cardedge connector.

BRIEF DESCRIPTION OF THE DRAWINGS

The objects and advantages of the invention will become apparent from the following detailed description of preferred embodiments thereof in connection with the accompanying drawings, in which like numerals designate like elements and in which.

DETAILED DESCRIPTION OF PREFERRED EMBODIMENTS OF THE INVENTION

Figure 1:
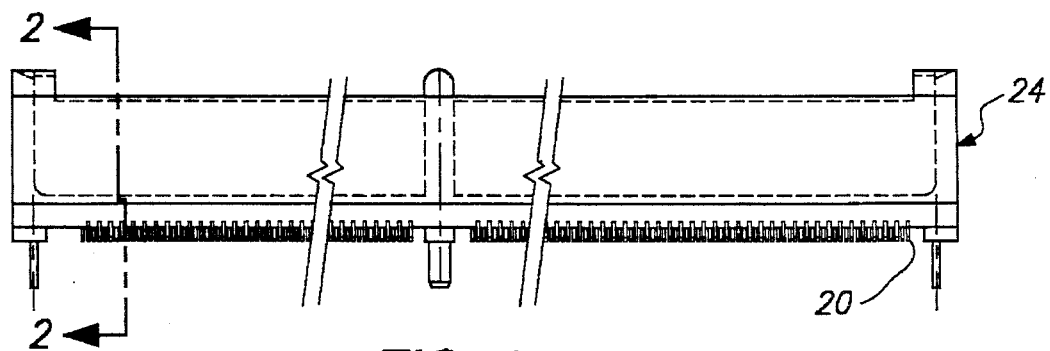
FIG. 1 is a plan view of a prior art cardedge connector.
Figure 2:
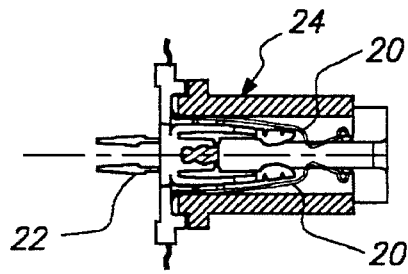
FIG. 2 is a cross-sectional view taken along the line 2—2 in FIG. 1.
Figure 4:
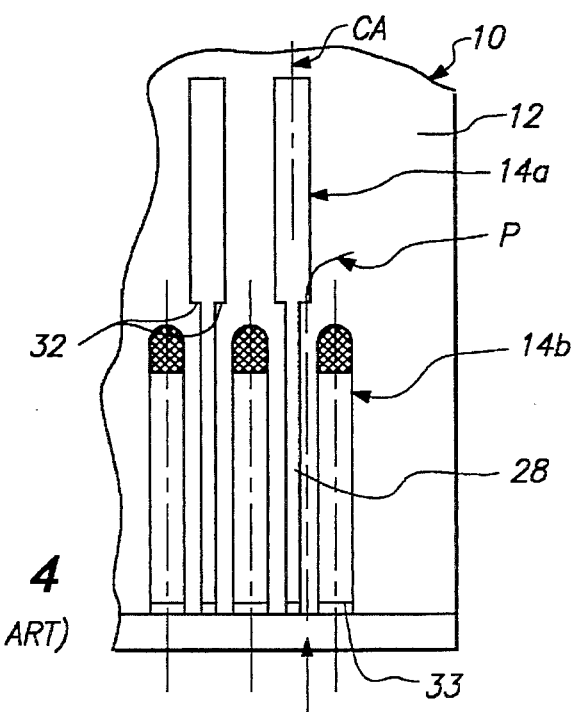
FIG. 4 is an enlarged fragmentary view of the portion A of FIG. 3.
Figure 3:
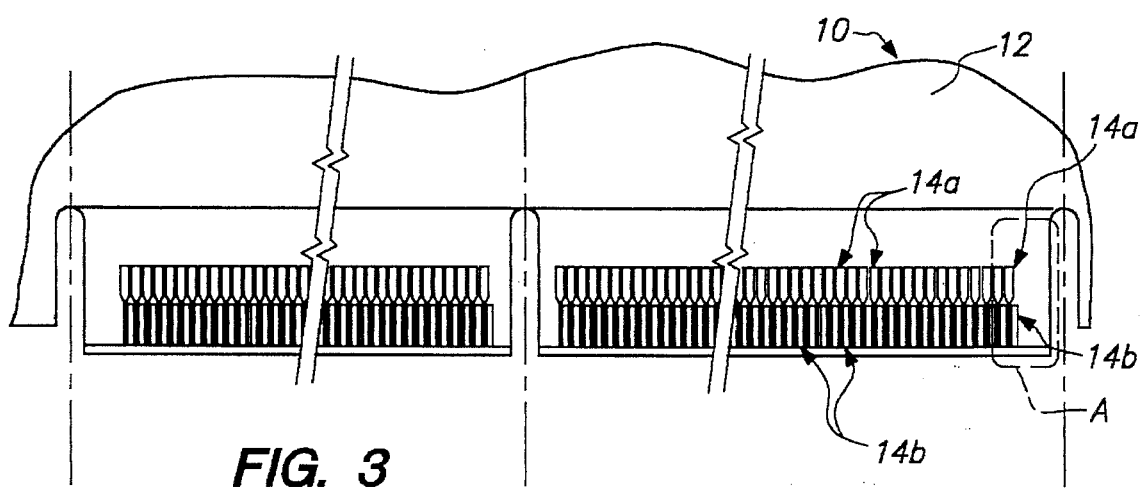
FIG. 3 is a plan view of a prior art printed circuit board.
Figure 5:
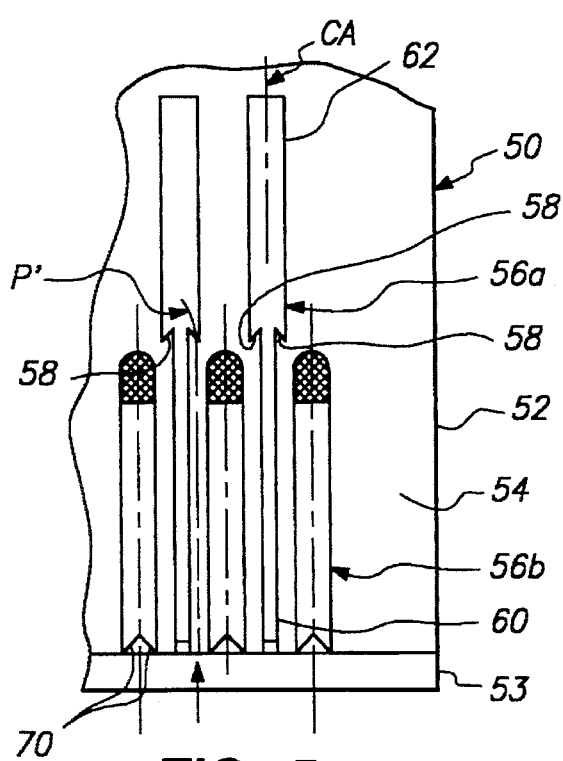
FIG. 5 is a view similar to FIG. 4 of a first embodiment of the present invention.

Depicted in FIG. 5 is a printed circuit board (p.c. board) 50 according to one preferred embodiment of the present invention. The p.c. board is intended for use with a conventional cardedge connector 24 of the type depicted in FIGS. 1 and 2, e.g., a cardedge connector of a personal computer. As described earlier, the connector 24 includes a housing which forms a slot 22 for receiving the p.c. board. Disposed on opposite sides of the slot 22 are respective rows of contacts 20. The contacts 20 are prestressed so as to be biased toward the slot 22 and are flexed away from the slot in response to the insertion of a p.c. board into the slot 22. The contacts 20 can be gold plated and soldered to a main logic board (not shown).

Figure 6:
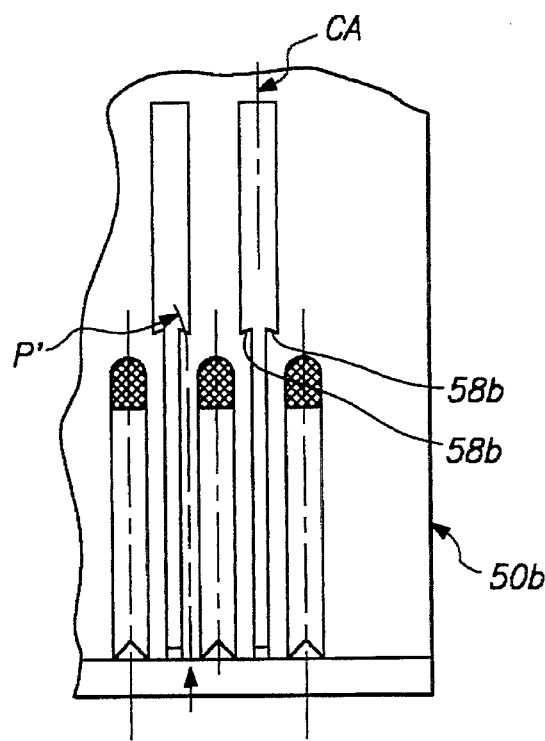
FIG. 6 is a view similar to FIG. 5 of a second embodiment of the present invention.
Figure 7:
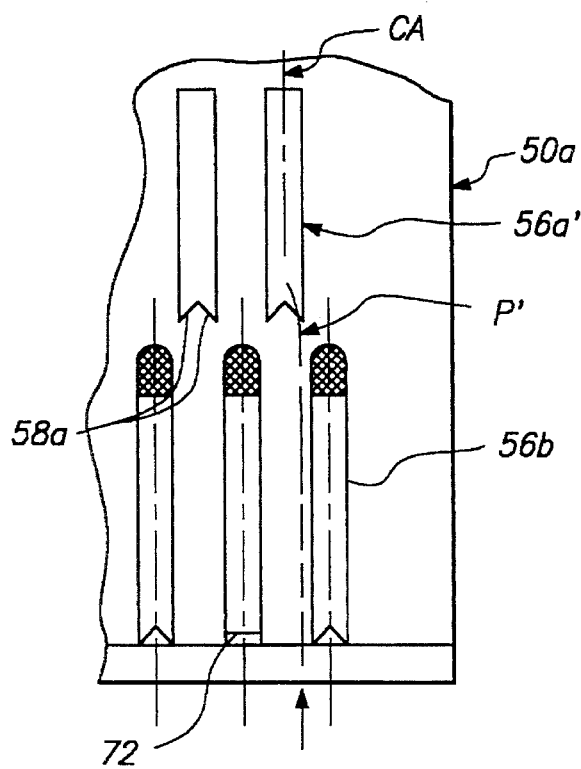
FIG. 7 is a view similar to FIG. 5 of a third embodiment of the present invention.

The p.c. board 50 can be of any suitable type, such as a processor card. The preferred p.c. board 50 includes a base 52 having opposite flat side surfaces 54 (only one side surface depicted). Formed on each of those surfaces 54 are two rows of electrically conductive, raised, gold-plated conductors or pads 56a, 56b. The jobs extend toward a side edge 53 of the circuit board. The pads 56a of one row are staggered with respect to the pads 56b. The pads 56a include frontal edge segments 58 which extend laterally with respect to the center axis CA of the pad. In some cases it may be desirable for each pad 56a to include a narrow forward trace 60 extending axially forwardly from the frontal edge segments 58 and disposed between an adjacent pair of the other pads 56b in order to provide a smooth surface on which the contacts 20 can travel to minimize abrasion of the gold plating therefrom. FIG. 5 depicts such a narrow trace 60, whereas FIG. 7 depicts a p.c. board 50A in which no narrow forward traces are provided. In FIG. 7 the frontal edge segments 58A are disposed at the very forward end of its respective pad 56a', whereas in FIG. 5 the frontal edge segments 58 are disposed at the junction of forward and rearward portions 60, 62 of the pad. Each frontal edge segment 58 extends rearwardly and inwardly toward the center axis CA of its respective pad 56a. The frontal edge segments can be straight as shown in FIG. 5, or curved as shown in FIG. 6 wherein frontal edge segments 58B are concavely curved rearwardly toward the center axis CA.

With reference to FIG. 5, it will be appreciated that if, during the insertion of the p.c. board 50 into the slot of the cardedge connector 24, one or more of the contacts 20 is not aligned with (i.e., is laterally offset from) the center axis CA of its respective pad 56a, (i.e., is not aligned with its intended direction of travel), the contact will encounter one of the frontal edge segments 58 of the pad, and be diverted thereby toward the center axis CA. That is, the rearward and inward inclination of the frontal edge segments causes a similarly directed force to be imposed upon the contact. A similar path of travel P' would also result in connection with the frontal edge segments 58A, 58B shown in FIGS. 6 and 7.

The shifting of the contact(s) toward the center axis CA tends to ensure that the contacts 20 will properly engage the pads 14 once the p.c. board 50, 50A, 50B has been inserted into the connector 24, even though one or more of the contacts may gave been initially offset laterally with respect to the center axis CA of their respective pads. This reduces the level of dimensional tolerance which is required during manufacture of the p.c. board and connector, so that manufacturing efforts and costs are reduced.

The other pads 56b also include frontal edges that can be configured in a manner similar to those of the pads 56a. In FIG. 5, each of the pads 56b includes a pair of frontal edge segments 70 which extend rearwardly and inwardly toward the center axis of the pad.

It is not necessary for every pad 56a, 56b to be provided with inclined front edges. If the respective contact 20 in the connector 24 is sufficiently wide, such an inclination of the frontal edge may not be needed. FIG. 7 depicts a state in which one of the pads 56b has a frontal edge 72 that is not inclined.

Figure 8:
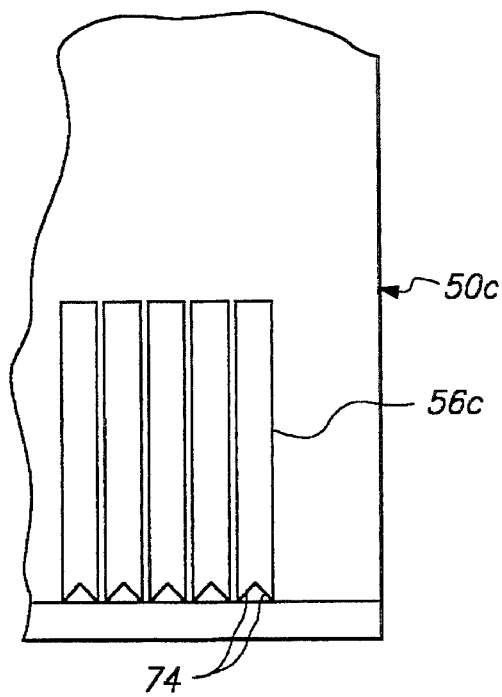
FIG. 8 is a view similar to FIG. 5 of a fourth embodiment of the present invention.

The present invention can also be used in connection with a non-staggered pad arrangement. Such an arrangement is shown in FIG. 8 wherein a board 50c has only one row of pads 56c, each of the pads 56c having inclined frontal edge segments 74.

Although the present invention has been described in connection with preferred embodiments thereof, it will be appreciated by those skilled in the art that additions, deletions, modifications, and substitutions not specifically described may be made without departing from the spirit and scope of the invention as defined in the appended claims.

What is claimed is:

1. A printed circuit board installable in a cardedge connector having a plurality of contacts arranged to engage respective electrically conductive pads on the printed circuit board, the printed circuit board comprising a base having a side edge extending along one side thereof and a plurality of electrically conductive raised pads disposed on a surface of the base, at least one of the pads forming a frontal edge arranged to be engaged by a contact during installation of the circuit board into the connector, the frontal edge defining a pair of frontal edge segments disposed on opposite sides of a center axis of the pad, each of the frontal edge segments extending in a direction toward the center axis and away from the side edge for directing toward the pad center axis a contact which is offset laterally with respect to the pad center axis during installation of the printed circuit board into the cardedge connector.

2. In combination, a printed circuit board and a cardedge connector mounted on a personal computer, the cardedge connector including a housing forming a slot, and a row of contacts disposed on a side of the slot, the printed circuit board comprising a base having a side edge extending along one side thereof and a plurality of electrically conductive raised pads disposed on a surface of the base, the base configured for installation into the slot of the connector such that the contacts engage and slide along respective ones of the pads, at least one of the pads forming a frontal edge arranged to be engaged by a contact during installation of the circuit board into the connector, the frontal edge defining a pair of frontal edge segments disposed on opposite sides of a center axis of the pad, each of the frontal edge segments extending in a direction toward the center axis and away from the side edge for directing toward the pad center axis a rearwardly traveling contact which is offset laterally with respect to the pad center axis during installation.

3. The printed circuit board according to claim 1, wherein each frontal edge segment is substantially straight.

4. The printed circuit board according to claim 1, wherein each frontal edge segment is concavely curved.

5. The printed circuit board according to claim 1, wherein each of the pads includes a rearward portion and a forward portion, the forward portion being disposed closer to the side edge and narrower than the rearward portion, the frontal edge segments of the at least one pad being disposed at a juncture between the forward and rearward portions and oriented laterally outwardly with respect to the respective sides of the forward portion.

6. The printed circuit board according to claim 1, wherein the at least one pad comprises all of the pads.

7. The combination according to claim 2, wherein the at least one frontal edge segment is substantially straight.

8. The combination according to claim 2, wherein the at least one frontal edge segment is concavely curved.

9. The combination according to claim 2, wherein there are two rows of contacts disposed on respective sides of the connector slot.

10. The combination according to claim 2, wherein each of the pads includes a rearward portion and a forward portion, the forward portion being disposed closer to the side edge and narrower than the rearward portion, the frontal edge segments of the at least one pad being disposed at a juncture between the forward and rearward portions and oriented laterally outwardly with respect to respective sides of the forward portion.

* * * * *